(12) United States Patent
Liou et al.

(10) Patent No.: US 10,453,849 B2
(45) Date of Patent: Oct. 22, 2019

(54) DYNAMIC RANDOM ACCESS MEMORY STRUCTURE AND METHOD FOR FORMING THE SAME

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: En-Chiuan Liou, Tainan (TW); Yu-Cheng Tung, Kaohsiung (TW); Chih-Wei Yang, Tainan (TW); Sho-Shen Lee, New Taipei (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/936,396

(22) Filed: Mar. 26, 2018

(65) Prior Publication Data
US 2019/0273083 A1    Sep. 5, 2019

(30) Foreign Application Priority Data
Mar. 1, 2018  (CN) .......................... 2018 1 0171723

(51) Int. Cl.
*H01L 29/02*     (2006.01)
*H01L 27/108*    (2006.01)
*G11C 11/401*    (2006.01)

(52) U.S. Cl.
CPC ...... *H01L 27/10897* (2013.01); *G11C 11/401* (2013.01); *H01L 27/10844* (2013.01)

(58) Field of Classification Search
CPC ................................................. H01L 27/10897
USPC ....................................................... 257/296
See application file for complete search history.

(56) References Cited

U.S. PATENT DOCUMENTS

| 6,054,355 A * | 4/2000 | Inumiya ............ H01L 21/28114 257/E21.205 |
| 6,238,996 B1 * | 5/2001 | Liu .................... H01L 21/76232 257/E21.549 |
| 6,717,267 B1 * | 4/2004 | Kunikiyo ............. H01L 23/5283 257/758 |
| 9,859,283 B1 * | 1/2018 | Feng ................. H01L 27/10885 |
| 9,985,035 B1 * | 5/2018 | Feng ................. H01L 27/10885 |
| 2007/0218629 A1 * | 9/2007 | Kronke ............. H01L 27/10858 438/257 |
| 2012/0228678 A1 | 9/2012 | Han |
| 2019/0019805 A1 * | 1/2019 | Feng ................. H01L 27/11573 |

* cited by examiner

*Primary Examiner* — Jami Valentine Miller
(74) *Attorney, Agent, or Firm* — Winston Hsu

(57) ABSTRACT

The present invention provides a dynamic random access memory structure, comprising a substrate defining a cell region and a peripheral region on the substrate, a shallow trench isolation structure located in the peripheral region adjacent to the cell region, wherein the shallow trench isolation structure has a concave top surface, a first dummy bit line gate located within the shallow trench isolation structure of the peripheral area, and a second dummy bit line gate located in the cell region and adjacent to the first dummy bit line gate, wherein a top surface of the first dummy bit line gate is lower than a top surface of the second dummy bit line gate.

6 Claims, 9 Drawing Sheets

DYNAMIC RANDOM ACCESS MEMORY STRUCTURE AND METHOD FOR FORMING THE SAME

BACKGROUND OF THE INVENTION

1. Field of the Invention

The present invention relates to a semiconductor structure and a method of fabricating the same, and more particularly to a dynamic random access memory structure having concave shallow trench isolation structures and a fabrication method thereof.

2. Description of the Prior Art

Planarization is useful in semiconductor industries, among different approaches, chemical mechanical polishing (hereinafter abbreviated as CMP) process is a common technique widely used to remove excess deposited materials and to provide a planar surface for subsequent levels or processes. In general, CMP process is performed to planarize layer(s) deposited on a patterned layer or a structure. And today, it has become one of the critical processes in the semiconductor fabrication flow.

The miniaturization of integrated circuits has been a key driving force behind technological innovations. Miniaturization of devices and interconnects has occurred because of the rapid advances in various fabrication technologies. As mentioned above, CMP process is performed to planarize layer(s) and thus to reduce topography variation of a wafer. However it is found that IC(s) nowadays include various devices and thus complexity and challenges are arisen to the manufacturing processes, including CMP process. For example, step height has been found between different devices or different regions. The basic problem in this respect is that different densities and spacing of features in the layout of a semiconductor chip influence the planarizing properties of the CMP process. Unfavorably selected processing parameters then lead to a large variation in layer thickness across the chip surface subsequent to the CMP process (global topography). On the other hand, an unfavorably selected circuit layout leads to insufficient planarizing. The insufficient planarizing impairs the follow-up processes and thus the product characteristics.

Therefore, it is still in need to provide a method for forming the semiconductor IC structure that is able to simplify CMP process and to eliminate the step height issue.

SUMMARY OF THE INVENTION

The present invention provides a dynamic random access memory structure, comprising a substrate defining a cell region and a peripheral region on the substrate, a shallow trench isolation structure located in the peripheral region adjacent to the cell region, wherein the shallow trench isolation structure has a concave top surface, a first dummy bit line gate located within the shallow trench isolation structure of the peripheral area, and a second dummy bit line gate located in the cell region and adjacent to the first dummy bit line gate, wherein a top surface of the first dummy bit line gate is lower than a top surface of the second dummy bit line gate.

The present invention further provides a method for forming a dynamic random access memory (DRAM) structure, the method including: firstly, a substrate is provided, a cell region and a peripheral region are defined on the substrate, next, a shallow trench isolation structure is formed in the peripheral region adjacent to the cell region, wherein a concave top surface is formed on the shallow trench isolation structure, afterwards, a first dummy bit line gate is formed within the shallow trench isolation structure of the peripheral area, and a second dummy bit line gate is formed in the cell region and adjacent to the first dummy bit line gate, wherein a top surface of the first dummy bit line gate is lower than a top surface of the second dummy bit line gate.

The present invention is characterized in that a dummy shallow trench isolation structure having a concave top surface is formed, and the first dummy bit line gate is then formed on the dummy shallow trench isolation structure, resulting in a top surface of the first dummy bit line gate is lower than the top surfaces of other bit line gates in the surrounding region.

In the present invention, the top surface of the first dummy bit line gate in the large area is lowered in a previous step, so the planarization step does not stop in the large area. As a result, the mask layer on the top of all bit line gates in the cell region can be reliably removed, to improve the device yield.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
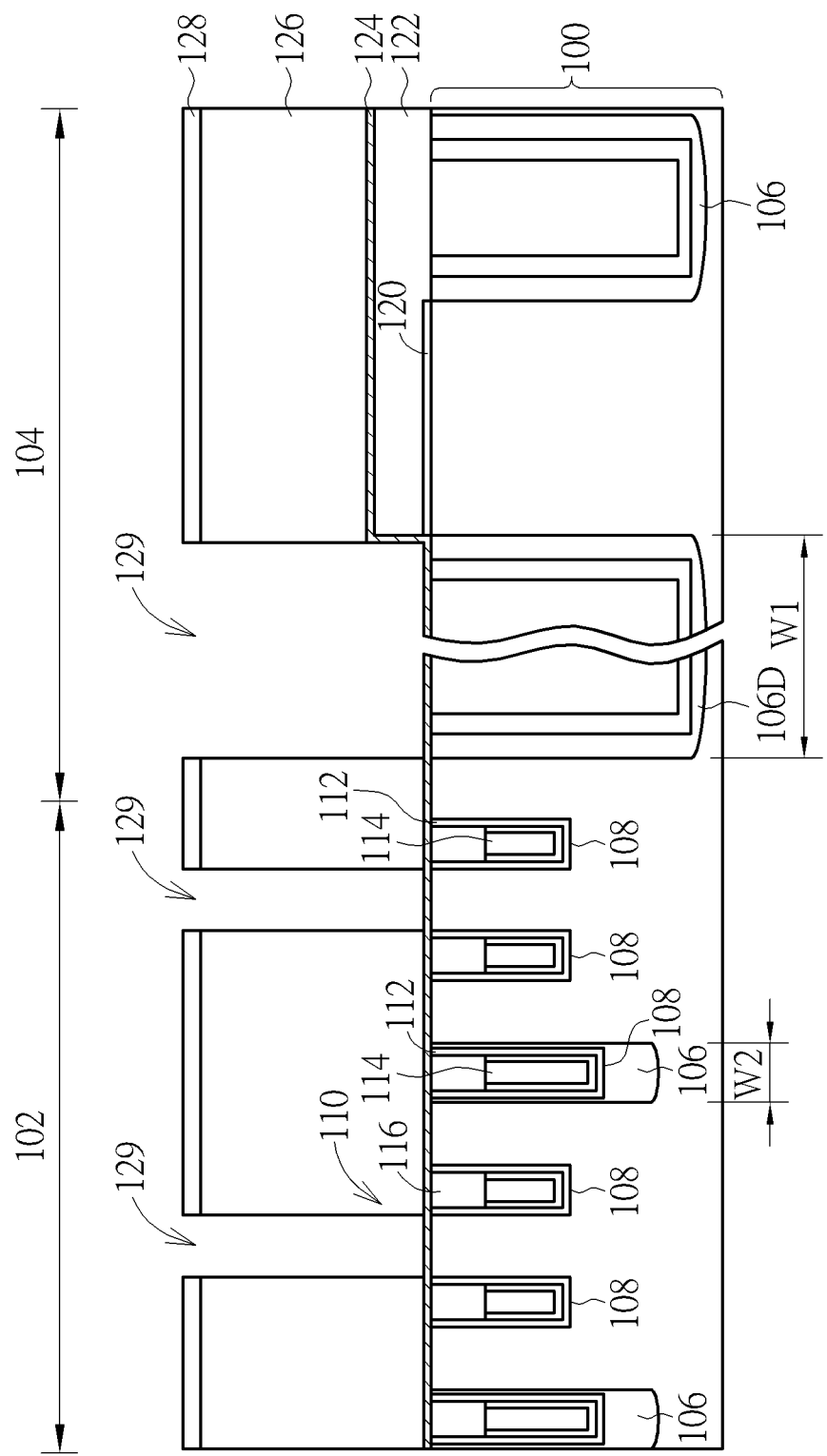
FIG. 1 to FIG. 8 are schematic diagrams of a first preferred embodiment of a method for forming a dynamic random access memory structure provided by the present invention.

Please refer to FIG. 1 to FIG. 8, which are schematic diagrams of a first preferred embodiment of a method for fabricating a dynamic random access memory structure provided by the present invention. As shown in FIG. 1, the method for forming a dynamic random access memory structure provided by the preferred embodiment including: firstly, a substrate 100 is provided. A cell region 102 and a peripheral region 104 are defined on the substrate 100, and a plurality of transistors of memory cells 100 are formed in the cell region 102. In the preferred embodiment, the memory cell 110 may include dynamic random access memory (DRAM). However, in other embodiments of the present invention, the memory cell 110 may include other types of memory. The present invention is not limited thereto.

As shown in FIG. 1, in an embodiment of the present invention, each memory cell 110 may be formed by the following steps: Firstly, a plurality of shallow trench isolation structure (STI) structures 106 are formed in the cell region 102 and in the peripheral region 104. In some embodiments of the present invention, a depth of the shallow trench isolation structures 106 in the cell region 102 may less than a depth of the shallow trench isolation structures 106 in the peripheral region 104, as shown in FIG. 1. However, in other embodiments of the present invention, the shallow trench isolation structure 106 in the cell region 102 and in the peripheral region 104 may include the same depth. The shallow trench isolation structures 106 formed in the cell region 102 and in the peripheral region 104 are used to define a plurality of active regions for accommodating the p-type transistor element and/or the n-type transistor element, and used to electrically isolating the active regions to each other. It is also worth noting that in the present invention, the shallow trench isolation structure at the interface between the cell region 102 and the peripheral region 104 is defined as the dummy shallow trench isolation structure 106D. In subsequent processes, some dummy elements, such as dummy bit line gates, may be formed on the dummy shallow trench isolation structure 106D. In general, the width of the dummy shallow trench isolation structure 106D at the interface between the cell region 102 and the peripheral region 104 will be much larger than the width of each device in the cell region 102. In other words, the width W1 shown in FIG. 1 will be much larger than the width W2 of the shallow trench isolation structure 106 in the cell region 102.

Next, a plurality of recesses 108 are formed in the shallow trench isolation structure 106 and the substrate 100 within the cell region 102, and a dielectric layer 112 is formed to cover the sidewalls and the bottom of each recess 108. A plurality of buried gates 114 are then formed in the recesses 108, the buried gates can be deemed as a plurality of buried word lines. And after the buried gates 114 are formed, an insulating layer 116 is formed to seal each recess 108. Therefore, the embedded gate 114 of the transistor of the memory cell 110 is formed in the cell region 102. However, it will be understood by those skilled in the art that the memory cell 110 can be formed by any suitable processes and steps, and the present invention is not limited thereto.

Please still refer to FIG. 1. Next, a gate dielectric layer 120 is formed in the peripheral region 104, and after the gate dielectric layer 120 is formed, a first semiconductor layer 122 is formed on the substrate 100. The first semiconductor layer 122 is then patterned so that the first semiconductor layer 122 remains only in the peripheral region 104. It should be noted that in the present invention, the first semiconductor layer 122 does not cover the dummy shallow trench isolation structure 106D. Then, an insulating layer 124 is formed to cover the first semiconductor layer 122 on the substrate 100, and as shown in FIG. 1, the insulating layer 124 contacts the first semiconductor layer 122 and the substrate 100. In some embodiments of the present invention, the first semiconductor layer 122 may include an amorphous silicon layer, and the first semiconductor layer 122 may have a thickness of about 300 angstroms (Å), but is not limited thereto. In some embodiments of the present invention, the insulating layer 124 may include a multilayered structure (composite layer structure), and the composite layer structure may include an oxide-nitride-oxide (ONO) structure, but is not limited thereto. In addition, the insulating layers 124 may have a thickness greater than 80 Å. However, in other embodiments of the present invention, the insulating layer 124 may also be a dual-layered structure or a single-layered structure, and the thickness of the insulating layer 124 may be any suitable value.

Please still refer to FIG. 1. Next, a sacrificial layer 126 is blanketly formed on the substrate 100, and a patterned hard mask 128 is formed on the sacrificial layer 126. The sacrificial layer 126 may be an organic density layer or an organic dielectric layer, but is not limited thereto. In an embodiment of the present invention, the patterned hard mask 128 preferably includes a pattern for defining a position and a size of the subsequent contact plug to be formed, and also corresponds to the position of the dummy shallow trench isolation structure 106D. Thereafter, the pattern of the patterned hard mask 128 is transferred to the sacrificial layer 126, and a plurality of openings 129 are formed in the sacrificial layer 126, as shown in FIG. 1. It is worth noting that the insulating layer 124 is exposed at the bottom of these openings 129.

Figure 2:
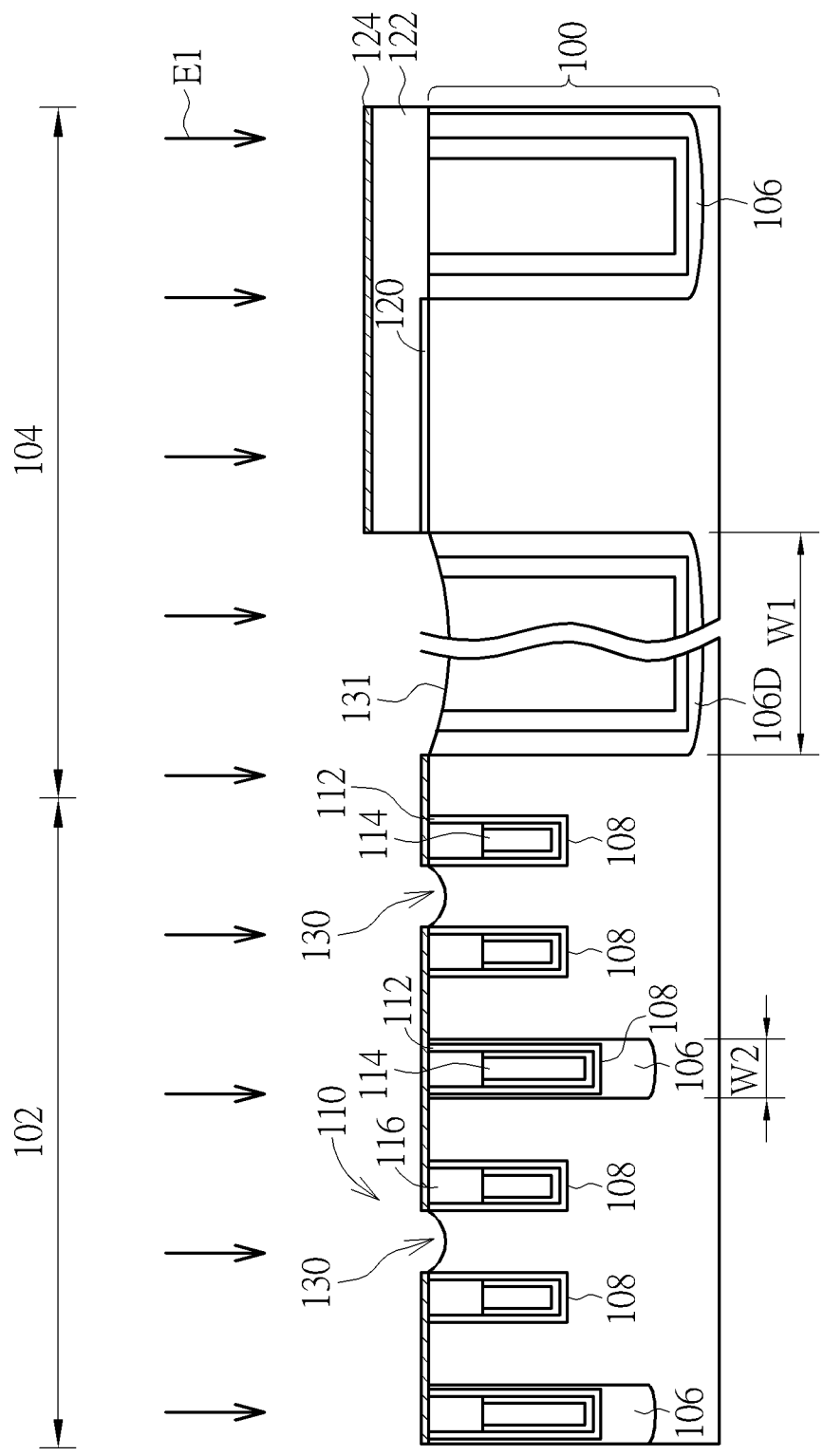

Please refer to FIG. 2. Then, a first etching step E1 is performed to remove the exposed insulating layer 124 at the bottom of the opening 129 and a portion of the substrate 100 under the insulating layer, and also remove a portion of the dummy shallow trench isolation structure 106D at the same time. Therefore, a plurality of recesses 130 are formed in the cell region 102, to define the position of each bit line contact plug, and a concave top surface 131 is formed on the top of the dummy shallow trench isolation structure 106D. Next, an impurity doping process, such as a p-type dopant is doped into the substrate 100 exposed at the bottom of the recess 130, to prevent leakage. The sacrificial layer 126 and the patterned hard mask 128 are then removed, as shown in FIG. 2.

Figure 3:
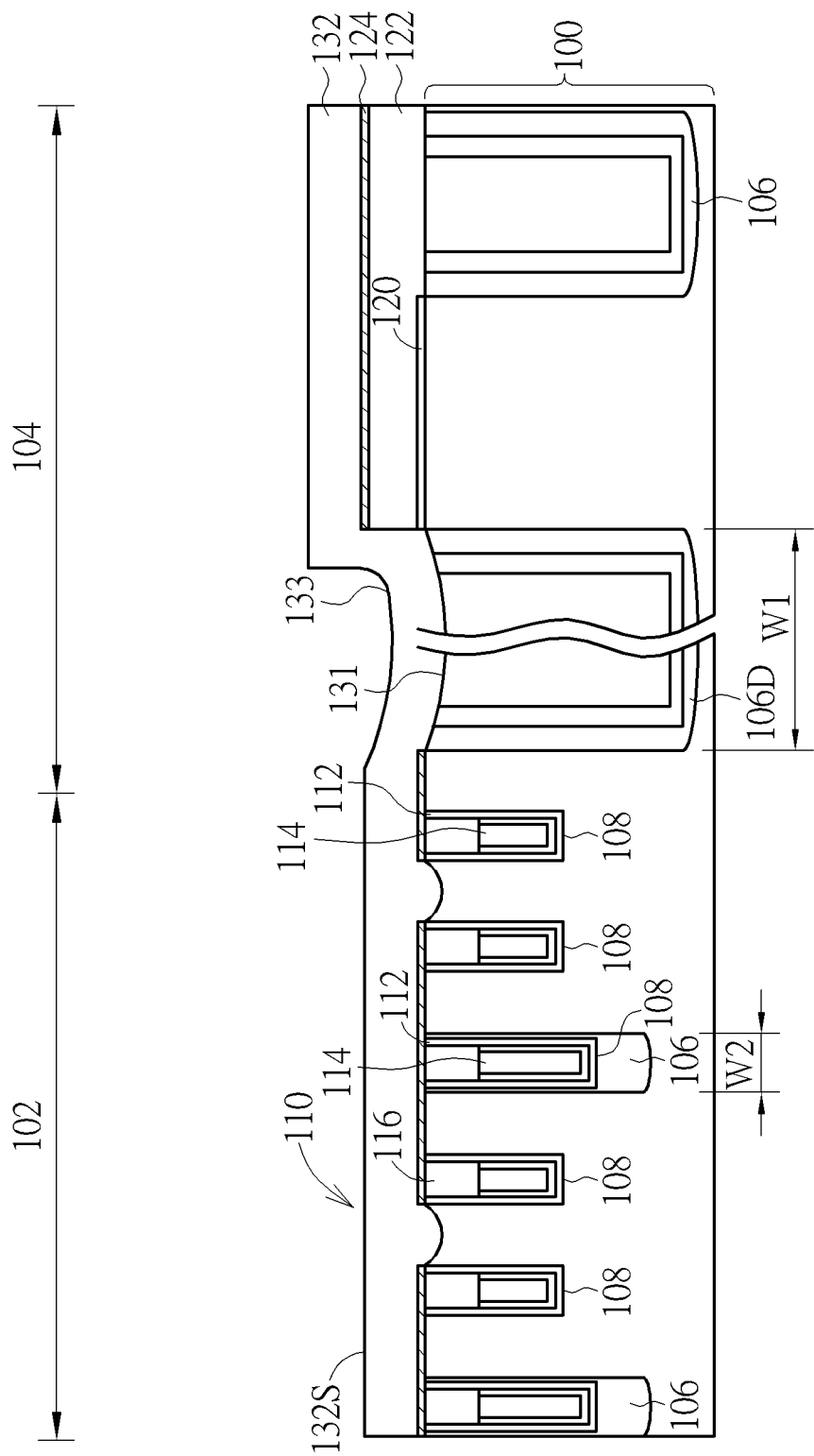

Next, a second semiconductor layer 132 is formed on the substrate 100. As shown in FIG. 3, the second semiconductor layer 132 covers the substrate 100, the first semiconductor layer 122, and the insulating layer 124. More importantly, the second semiconductor layer 132 is filled in the concave top surface 131 of the dummy shallow trench isolation structure 106D and the recesses 130. The second semiconductor layer 132 preferably includes the same material as the first semiconductor layer 122, so in some embodiments of the present invention, the second semiconductor layer 132 includes a doped amorphous silicon layer. The second semiconductor layers 132 may have a thickness greater than 800 Å, but is not limited thereto.

It is worth noting that the second semiconductor layer 132 covers the cell region 102 and a portion of the peripheral region 104. In the peripheral region 104, since the dummy shallow trench isolation structure 106D has the concave top surface 131, when the second semiconductor layer 132 covers the dummy shallow trench isolation structure 106D, a concave top surface 133 is also formed on the second semiconductor layer 132. That is, the concave top surface 133 will be lower than the top surface 132S of other portions of the second semiconductor layer 132.

Figure 4:
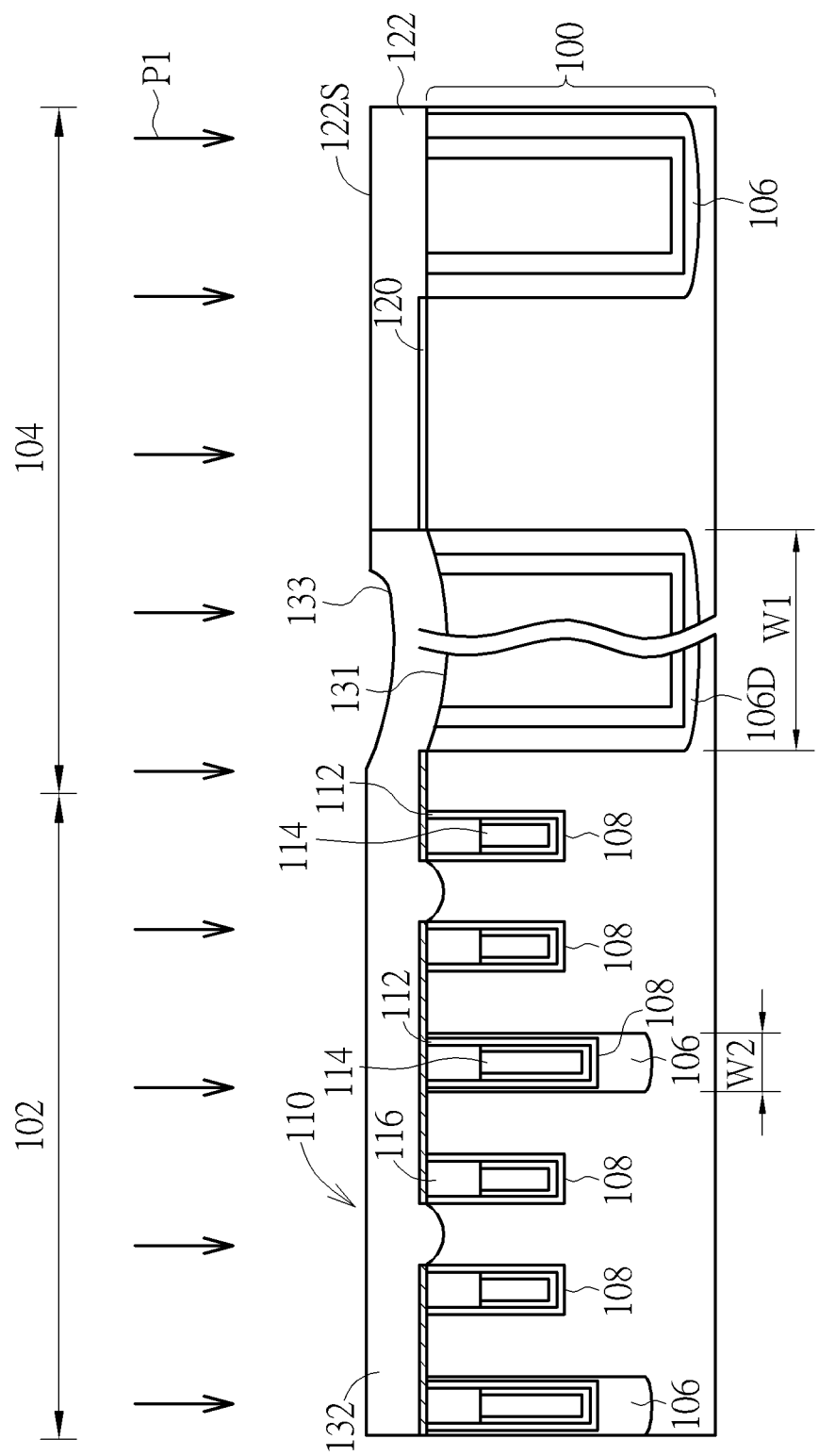

Please refer to FIG. 4. Afterwards, a planarization step P1 is performed to remove a portion of the second semiconductor layer 132 and a portion of the insulating layer 124, and expose the first semiconductor layer 122. In this embodiment, the planarization step P1 includes such as a plurality of chemical mechanical polishing (CMP) steps, and sequentially removes the second semiconductor layer 132 and the portion of the insulating layer 124 within the peripheral region 104. It is worth noting that after the planarization step P1 is performed, the top surface 122S of the first semiconductor layer 122 is still higher than the concave top surface 133 of the second semiconductor layer 132.

Figure 5:
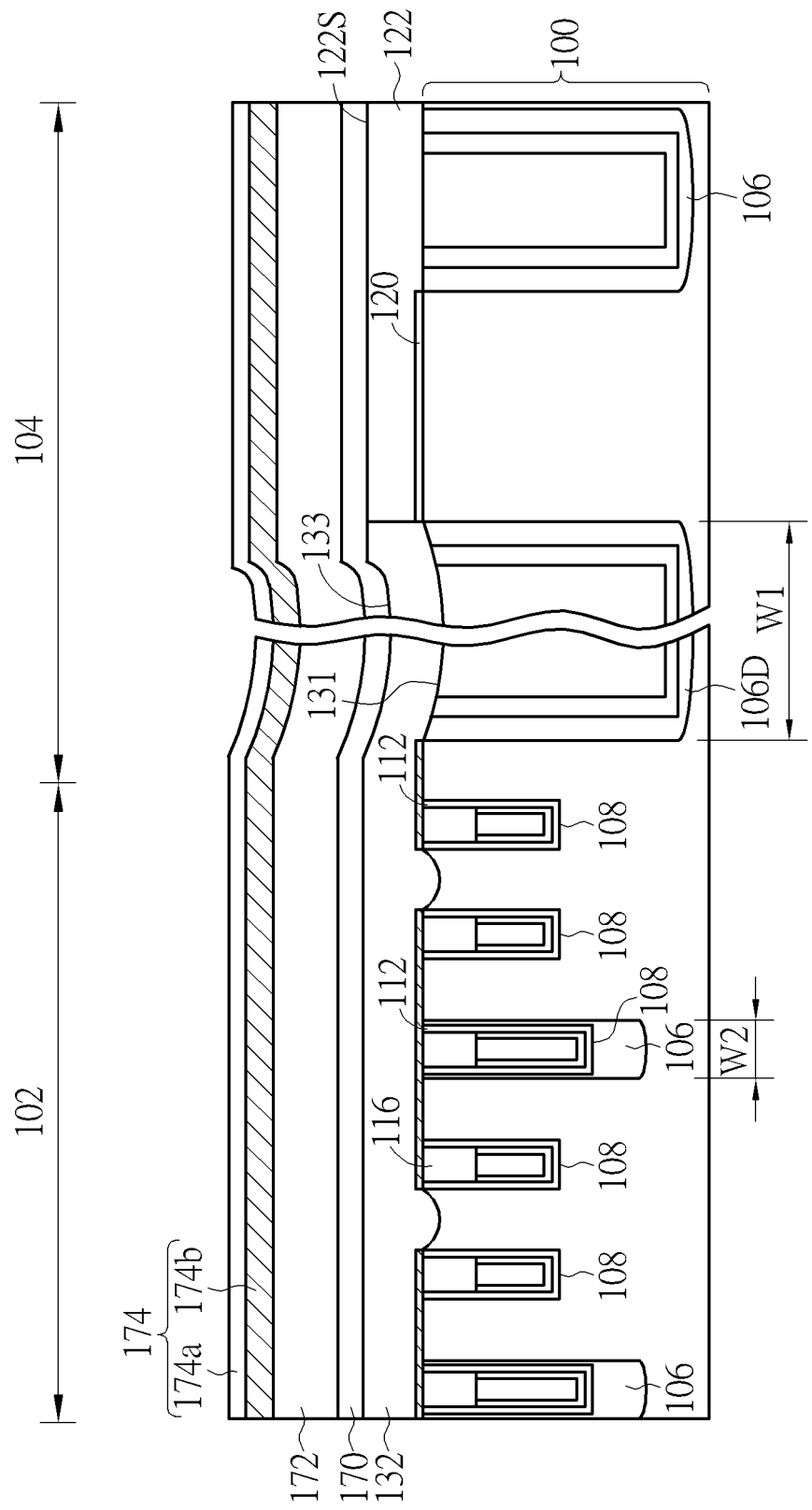
Figure 6:
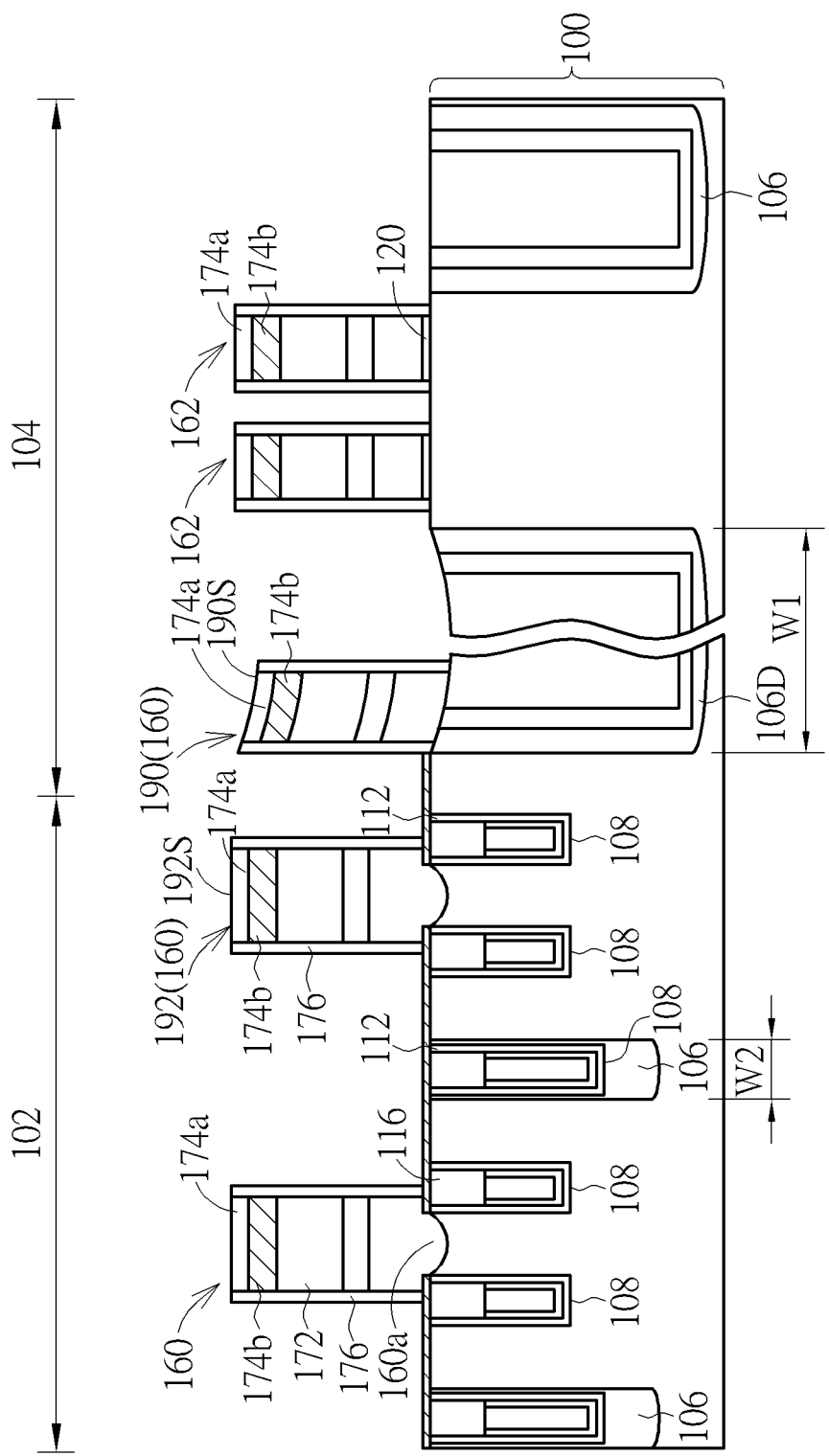

Referring to FIG. 5 and FIG. 6, as shown in FIG. 5, a composite layer structure is sequentially formed on the top surfaces of the first semiconductor layer 122 and the second semiconductor layer 132. In some embodiments of the present invention, the composite layer structure may include a barrier layer 170, a metal layer 172 and a mask layer 174. The barrier layer 170 is, for example, a titanium/titanium nitride (Ti/TiN) layer. The metal layer 172 is, for example, a tungsten silicide/tungsten (WSi$_x$/W) layer. The mask layer 174 may include a silicon oxide mask layer 174a and a silicon nitride mask layer 174b, but is not limited thereto. Similarly, the composite layer structure described above is formed on the concave top surface of the second semiconductor layer 132, which also causes the composite layer structure has a concave top surface.

Subsequently, as shown in FIG. 6, the mask layer 174, the metal layer 172, the barrier layer 170, the first semiconductor layer 122, and the second semiconductor layer 132 are patterned, to form a plurality of bit line contact plugs 160a and at least one bit line gate 160 in the cell region 102, and at least one gate electrode 162 is formed in peripheral region 104. The bit line contact plug 160a includes the second semiconductor layer 132, and the bit line gate 160 includes the second semiconductor layer 132 and the aforementioned composite layer structure. In addition, spacers 176 may continue to be formed subsequently, covering the sidewalls of the gate electrode 162 and the sidewalls of the bit line gate 160. The material of the spacers 176 is, for example, silicon nitride or silicon oxide, but is not limited thereto.

It should be noted that after the bit line gate 160 and the gate electrode 162 are patterned, the first dummy bit line gate 190 is defined, which is located on the dummy shallow trench isolation structure 106D in the peripheral region 104. In addition, a second dummy bit line gate 192 adjacent to the first dummy bit line gate 190 is defined. The second dummy bit line gate 192 is located in the cell region 102. That is, the cell region 102 has a boundary with the peripheral region 104, and the first dummy bit line gate 190 and the second dummy bit line gate 192 are respectively located on both sides of the above-mentioned boundary. In addition, the first dummy bit line gate 190 is completely located on the dummy shallow trench isolation structure 106D.

The present invention is characterized in that the first dummy bit line gate 190 is formed on the dummy shallow trench isolation structure 106D, and the dummy shallow trench isolation structure 106D has a concave top surface 131, so a top surface 190S of the first dummy bit line gate 190 will be lower than a top surface 192S of the second dummy bit line gate 192.

Figure 7:
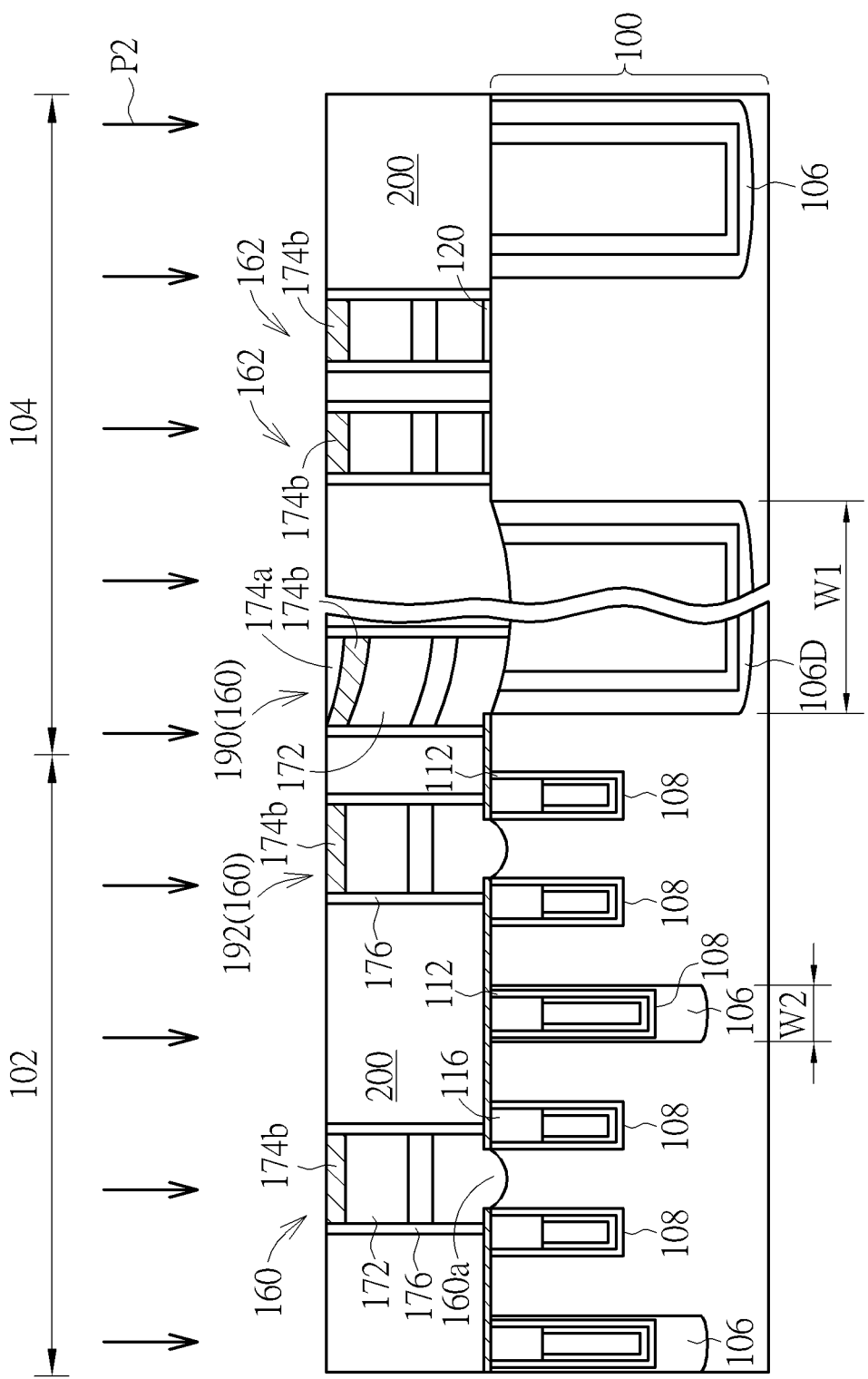
Figure 8:
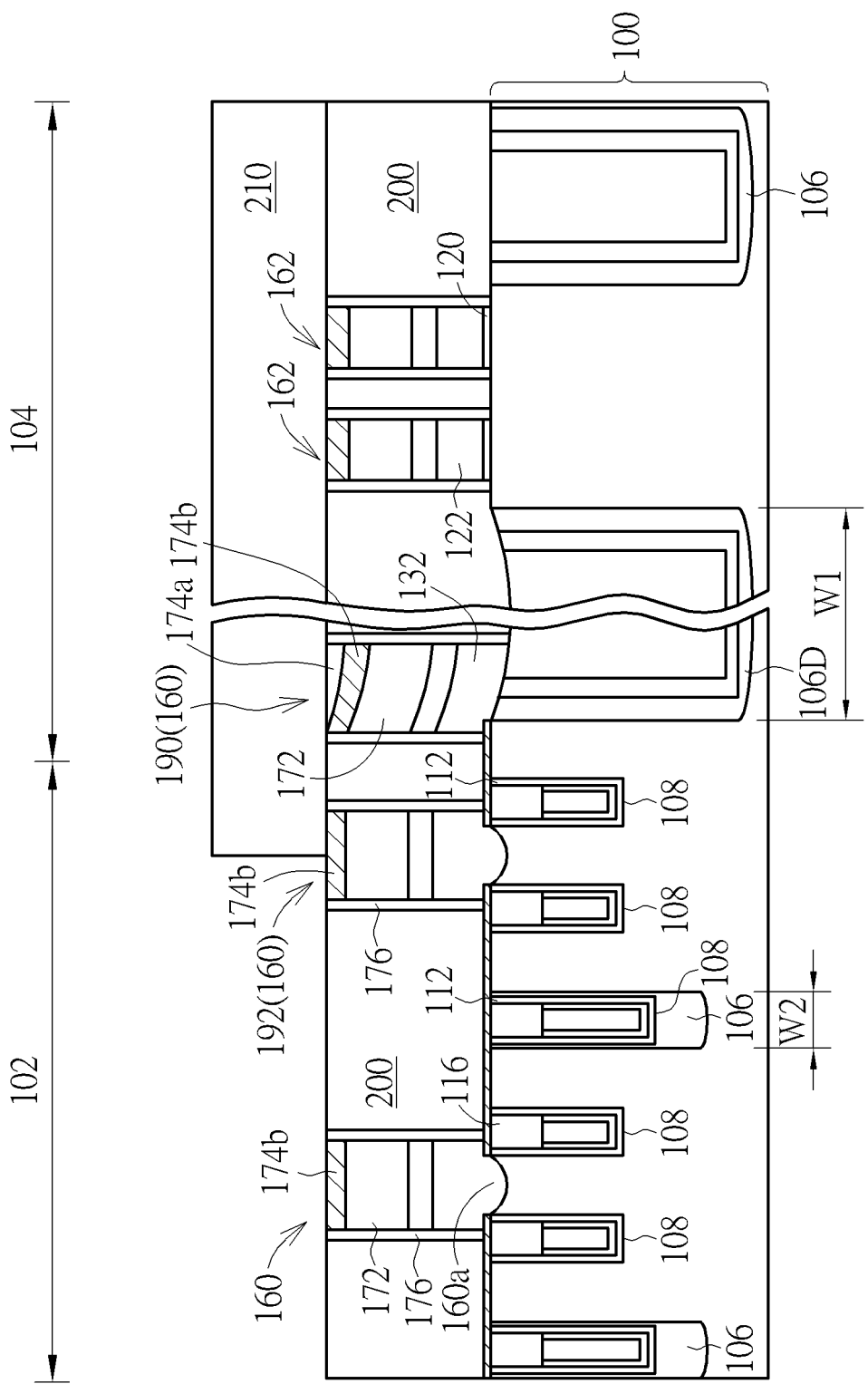

Please refer to FIG. 7 and FIG. 8. As shown in FIG. 7, in the subsequent steps, a dielectric layer 200 is formed to entirely cover each bit line gate 160 and the gate electrode 162, and at least parts of the dielectric layer 200 is filled in the gap between the first dummy bit line gate 190 and the second dummy bit line gate 192. A planarization step P2 is then performed to remove a portion of the dielectric layer 200, and to remove the silicon oxide mask layer 174a at the top of the bit line gate 160 and the gate electrode 162, so as to expose the silicon nitride mask layer 174b.

As shown in FIG. 8, a photoresist layer 210 is then covered in the peripheral region 104. In the subsequent step, an etching step (not shown) is performed in the cell region 102, to remove a portion of the dielectric layer 200 located in the cell region 102, and to form a plurality of recesses (not shown), and then forms, for example, a storage node contacts and other elements, which will be located in the recesses. The above steps are well-known in the art and are not described here.

In the present invention, since the mask layer 174 on the top surface of the first dummy bit line gate 190 is lower than the top surface of the second dummy bit line gate 192, so the mask layer 174 will be removed later in the planarization step P2. In other words, if the planarization step P2 is stopped at the top of the silicon nitride mask layer 174b, after the silicon oxide mask layer 174a on the top of the second dummy bit line gate 192 and other bit line gates 160 within the cell region 102 are completely removed, the silicon oxide mask layer 174a located on the top of the first dummy bit line gate 190 in the peripheral region 104 may partially remain, and the remaining silicon oxide mask layer 174a will be cause some issues, such as in the subsequent wet etching process for removing the dielectric layer 200 and for forming the storage node contact opening, causing an etchant (e.g., hydrofluoric acid) to penetrate the remaining silicon oxide mask layer 174a into the region covered by the photoresist layer 210, resulting in unexpected defects or the photoresist layer 210 being peeling off. In addition, in the present embodiment, the thickness of the mask layer 174 is uneven. In more detail, the terminal of the mask layer 174 near the peripheral region 104 has the largest thickness, and the terminal near the cell region 102 has the smallest thickness.

The present invention is characterized in that the dummy shallow trench isolation structure 106D having the concave top surface 131 is formed, and then the first dummy bit line gate 190 is formed on the dummy shallow trench isolation structure 106D, resulting in the top surface of the first dummy bit line gate 190 is lower than the top surfaces of the surrounding other bit line gates (e.g., the second dummy bit line gate 192 or the bit line gate 160).

The purpose of forming the above structure is to compensate for the phenomenon that the etching rate of the large area is faster when the planarization step is performed. In more detail, as described above, since the width of the dummy shallow trench isolation structure 106D is much larger than the width of other components, the dummy shallow trench isolation structure 106D can be considered as a large area. During the planarization step P2, the etching rate of the components in the large area will be slightly faster than the etching rate of the components in other areas. If the dummy shallow trench isolation structure 106D having the concave top surface 131 is not formed at this time (in other words, if the top surface of the first dummy bit line gate 190 and the top surfaces of other surrounded bit line gates are on a same level), it will easily lead to the silicon oxide mask layer 174a in the large area is completely removed, and the planarization step will stop. However, there is a silicon oxide mask layer 174a that has not been removed at the top of the bit line gate in the remaining areas. The subsequent etching step will be affected. For example, the photoresist layer 210 formed in FIG. 8 is peeled off due to the remaining silicon oxide mask layer 174a, thereby affecting the overall device yield.

In the present invention, the top surface of the first dummy bit line gate 190 in the large area is lowered in a previous step, so the planarization step P2 does not stop in the large area. As a result, the silicon oxide mask layer 174a on the top of all bit line gates 160 in the cell region 102 can be reliably removed, to improve the device yield.

Figure 9:
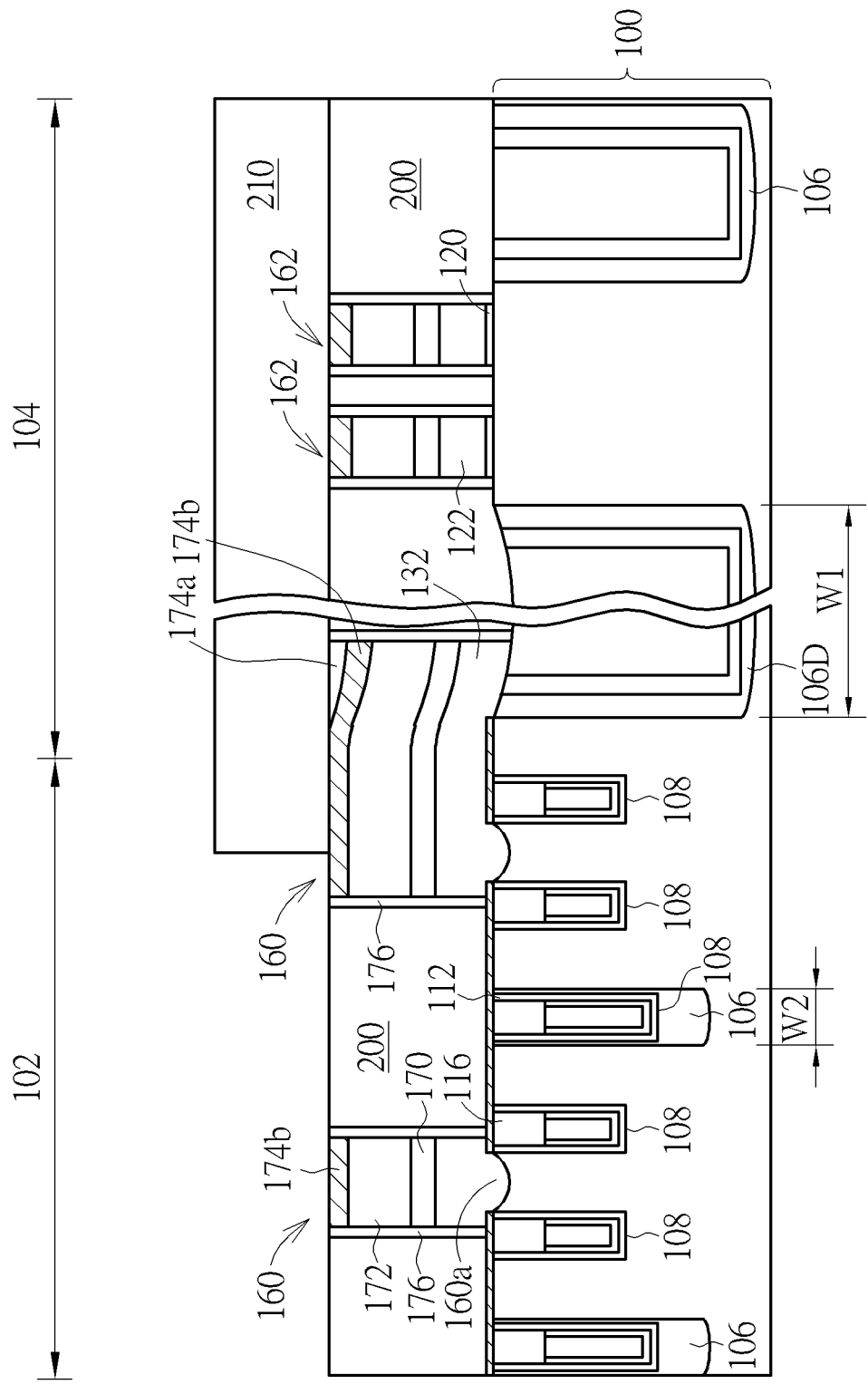
FIG. 9 is a schematic structural diagram of a dynamic random access memory according to another preferred embodiment of the present invention.

FIG. 9 is a schematic diagram of a semiconductor structure according to another preferred embodiment of the present invention. As shown in FIG. 9, in the present embodiment, the first dummy bit line gate 190 contacts the second dummy bit line gate 192 directly, and both are collectively defined as bit line gates 160. Except for the features describe above, other features, material properties, and manufacturing methods of the remaining components are similar to those of the above-described first preferred embodiment, and therefore will not be described herein.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A dynamic random access memory (DRAM) structure, comprising:
   a substrate having a cell region and a peripheral region defined thereon;
   a plurality of buried word lines, located in the cell region of the substrate;
   a shallow trench isolation structure located in the peripheral region adjacent to the cell region, wherein the shallow trench isolation structure has a concave top surface;
   a first dummy bit line gate located on the shallow trench isolation structure within the peripheral area; and
   a second dummy bit line gate located in the cell region and adjacent to the first dummy bit line gate, wherein a top surface of the first dummy bit line gate is lower than a top surface of the second dummy bit line gate.

2. The dynamic random access memory structure of claim 1, wherein the first dummy bit line gate is completely located on the shallow trench isolation structure.

3. The dynamic random access memory structure of claim 1, further comprising a dielectric layer disposed on the substrate and on the shallow trench isolation structure.

4. The dynamic random access memory structure of claim 3, wherein a portion of the dielectric layer is located between the first dummy bit line gate and the second dummy bit line gate.

5. The dynamic random access memory structure of claim 1, wherein the first dummy bit line gate contacts the second dummy bit line gate directly.

6. The dynamic random access memory structure of claim 1, wherein the first dummy bit line gate comprises a stacked structure of an amorphous silicon layer, a barrier layer and a metal layer.

* * * * *